(12) United States Patent
de Souza et al.

(10) Patent No.: US 10,276,816 B2
(45) Date of Patent: Apr. 30, 2019

(54) ILLUMINATION SENSITIVE CURRENT CONTROL DEVICE

(71) Applicant: International Business Machines Corporation, Armonk, NY (US)

(72) Inventors: Joel P. de Souza, Putnam Valley, NY (US); Bahman Hekmatshoartabari, White Plains, NY (US); Daniel M. Kuchta, Patterson, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/567,805

(22) Filed: Dec. 11, 2014

(65) Prior Publication Data
US 2016/0172526 A1    Jun. 16, 2016

(51) Int. Cl.
| | |
|---|---|
| H01L 51/42 | (2006.01) |
| H01L 31/18 | (2006.01) |
| H01L 27/14 | (2006.01) |
| H01L 31/112 | (2006.01) |
| H01L 31/20 | (2006.01) |

(52) U.S. Cl.
CPC .......... *H01L 51/4213* (2013.01); *H01L 27/14* (2013.01); *H01L 31/1129* (2013.01); *H01L 31/1804* (2013.01); *H01L 31/20* (2013.01); *H01L 51/428* (2013.01); *Y02E 10/547* (2013.01); *Y02E 10/549* (2013.01); *Y02P 70/521* (2015.11)

(58) Field of Classification Search
CPC .................... H01L 27/14; H01L 27/14616
See application file for complete search history.

(56) References Cited

U.S. PATENT DOCUMENTS

| | | | |
|---|---|---|---|
| 4,740,823 A * | 4/1988 | Thompson | ............ H01L 31/09 257/184 |
| 4,952,788 A | 8/1990 | Berger et al. | |
| 4,959,701 A | 9/1990 | Colquitt, Jr. et al. | |
| 5,027,177 A | 6/1991 | Vasudev | |
| 6,137,123 A | 10/2000 | Yang et al. | |
| 6,236,671 B1 | 5/2001 | Babic | |
| 7,675,056 B2 | 3/2010 | Lee et al. | |
| 8,298,855 B2 | 10/2012 | Ihama | |

(Continued)

FOREIGN PATENT DOCUMENTS

| | | |
|---|---|---|
| GB | 1497442 | 1/1978 |
| JP | 2009124010 A | 6/2009 |

*Primary Examiner* — Lex H Malsawma
*Assistant Examiner* — Geoffrey H Ida
(74) *Attorney, Agent, or Firm* — Isaac J. Gooshaw; Steven F. McDaniel; Arnold B. Bangali

(57) ABSTRACT

A semiconductor device that includes a layer of highly crystalline semiconductor material positioned on an insulating substrate. The semiconductor device also includes a source structure and a drain structure positioned on the layer of highly crystalline semiconductor material. The semiconductor device also includes a photoelectric element positioned on the layer of highly crystalline semiconductor material. The photoelectric element forms an electrical junction with the layer of highly crystalline semiconductor material. The photoelectric element is positioned between the source structure and the drain structure. The photoelectric element is also electrically floating.

14 Claims, 2 Drawing Sheets

(56) References Cited

U.S. PATENT DOCUMENTS

| | | |
|---|---|---|
| 8,354,324 B2 | 1/2013 | Yao |
| 2002/0072618 A1* | 6/2002 | Afzali-Ardakani .......................... C07D 333/24 549/6 |
| 2007/0235753 A1* | 10/2007 | Debucquoy ............ B82Y 10/00 257/113 |
| 2009/0206237 A1* | 8/2009 | Shannon ........... H01L 29/41733 250/214 AL |
| 2010/0109007 A1* | 5/2010 | Lee ................... G02F 1/134336 257/59 |
| 2010/0311200 A1* | 12/2010 | Hirota ............... H01L 27/14616 438/60 |
| 2011/0042553 A1 | 2/2011 | Masini et al. |
| 2013/0161626 A1* | 6/2013 | Jo ......................... H01L 27/156 257/59 |

\* cited by examiner

ILLUMINATION SENSITIVE CURRENT CONTROL DEVICE

BACKGROUND OF THE INVENTION

The present invention relates generally to the field of semiconductor devices, and more particularly to the control of electric current.

A transistor is a semiconductor device used to amplify and switch electronic signals and electrical power. It is composed of semiconductor material with at least three terminals for connection to an external circuit. A voltage or current applied to one pair of the transistor's terminals changes the current through another pair of terminals. Because the controlled (output) power can be higher than the controlling (input) power, a transistor can amplify a signal.

In many cases, transistors include a source terminal, a drain terminal, and a gate terminal. The gate terminal is in contact with a region of semiconductor material, such as silicon, which is also in contact with the source terminal and drain terminal. In most configurations, the gate terminal is located between the source terminal and drain terminal. A voltage is applied to the gate terminal to control the current flow from the source terminal, through the semiconductor material, and to the drain terminal. In this case, a region of semiconductor material functions as a channel that allows the current to flow from the source terminal to the drain terminal.

SUMMARY

One embodiment provides a semiconductor device that includes a layer of highly crystalline semiconductor material positioned on an insulating substrate. The semiconductor device also includes a source structure and a drain structure positioned on the layer of highly crystalline semiconductor material. The semiconductor device also includes a photoelectric element positioned on the layer of highly crystalline semiconductor material. The photoelectric element forms an electrical junction with the layer of highly crystalline semiconductor material. The photoelectric element is positioned between the source structure and the drain structure. The photoelectric element is also electrically floating.

One embodiment provides a method of forming a semiconductor device, the method comprising: forming a layer of highly crystalline semiconductor material on an insulating substrate; forming a source structure and a drain structure positioned on the layer of highly crystalline semiconductor material; and forming a photoelectric element positioned on the layer of highly crystalline semiconductor material, wherein the photoelectric element forms an electrical junction with the layer of highly crystalline semiconductor material, and wherein the photoelectric element is positioned between the source structure and the drain structure, and wherein the photoelectric element is electrically floating.

One embodiment provides a semiconductor device that includes a layer of highly crystalline semiconductor material positioned on an insulating substrate. The layer of insulating substrate is positioned on a layer of conductive material connected to a voltage source. The semiconductor device also includes a source structure and a drain structure positioned on the layer of highly crystalline semiconductor material. The semiconductor device also includes a photoelectric element positioned on the layer of highly crystalline semiconductor material. The photoelectric element forms an electrical junction with the layer of highly crystalline semiconductor material wherein i) the photoelectric element is positioned between the source structure and the drain structure, ii) the photoelectric element is electrically floating, and iii) the photoelectric element includes one or more of hydrogenated amorphous silicon containing layers. The semiconductor device also includes a layer of anti-reflection material covering at least a portion of the photoelectric element.

DETAILED DESCRIPTION

A photovoltaic cell, is an electrical device that converts the energy of light directly into electricity by the photovoltaic effect. Photoelectric cells are devices whose electrical characteristics, such as current, voltage, or resistance, vary when exposed to light like integrated circuits, many photovoltaic cells are constructed using layers of doped silicon.

The photo-sensitivity of amorphous and nano-crystalline silicon (Si) is better than single-crystalline or poly-crystalline Si due to their direct bandgap, but these materials have a lower mobility than crystalline Si. Therefore, in some applications, amorphous and nano-crystalline Si provide better light sensitivity (i.e. transition from OFF state to ON state with lower illumination); but in the ON-state they cannot provide the high-drive currents possible with crystalline materials, such as crystalline Si. Furthermore, the processing conditions used for crystalline Si devices are often too expensive and typically require manufacturing temperatures that are too high to be compatible with low-cost and/or flexible substrates desired for large-area applications.

The present invention will now be described in detail with reference to the Figures.

Figure 1:
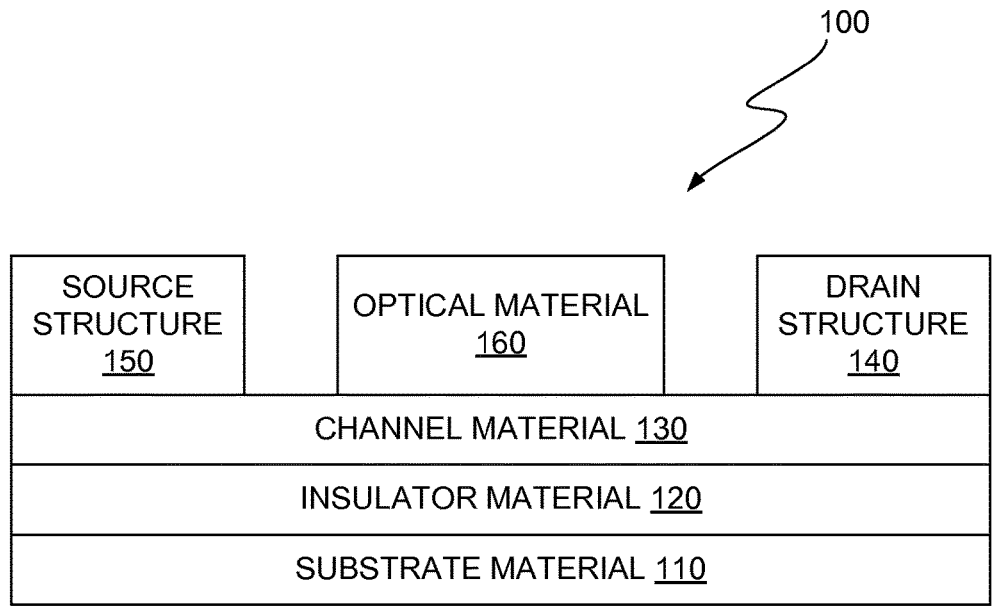
FIG. 1 illustrates a side cut-away view of a general configuration for a light controlled current regulator, in accordance with a first embodiment of the present invention.

FIG. 1 illustrates a general configuration for a light controlled current regulator (LCCR), 100, in accordance with a first embodiment of the present invention. As shown in FIG. 1, LCCR includes optical material 160, source structure 150, drain structure 140, channel material 130, insulator material 120, and substrate material 110. In one embodiment, substrate material 110 is a layer of material that provides support for other layers of material and structures disposed thereon. In other words, substrate material 110 is a layer of material that provides support for other layers of material and structures that are on top of substrate material 110. In one embodiment, insulator material 120 is a layer of non-conducting or dielectric material that electrically insulates substrate material 110 from other layers of material and structures included in LCCR 100.

In general, source structure 150 is biased with an electric current, which, when allowed by the activity of optical material 160 of LCCR 100, flows through channel material 130 to drain structure 140. Channel material 130 is, in this embodiment, a doped layer of silicon-containing material. In general, source structure 150 and drain structure 140 form ohmic contacts with channel material 130. In one embodiment, channel material 130 is composed of a material that allows for a high-drive current to flow through it when optical material 160 of LCCR 100 is not activated by luminosity. In one embodiment, channel material 130 is composed of one of mono-crystalline silicon (also called single-crystal silicon, single-crystal Si, mono c-Si, or just mono-Si) or poly-silicon (also called poly-silicon or poly-Si). In one embodiment, optical material 160 is a photoelectric element that is electrically floating. For example, optical material 160 is electrically floating in view of an insulation or non-conductive region (not shown)(for example, a layer of bulk-type material/substrate) that is included as part of optical material 160 and is in contact with channel material 130. In contrast with the composition of channel material 130, the composition of optical material 160 includes amorphous silicon (the non-crystalline allotropic form of silicon). In some embodiments, amorphous silicon included in an embodiment of an LCCR device is grown using plasma-enhanced chemical vapor deposition (PECVD) at temperatures below 400 degrees Celsius (° C.).

In general, optical material 160 and channel material 130 form a junction. Such a junction between optical material 160 and channel material 130 is a photosensitive junction. In various embodiments, such junctions include photovoltaic elements that generate a voltage bias across the junction. In some embodiments, optical material 160 includes a plurality of layers of various materials that form one or more p-n junctions, p-i-n junctions, or Schottky junctions, or combinations thereof. In some embodiments, optical material 160 and channel material 130 form a p-n junction, a p-i-n junction, or a Schottky junction. In general, a p-i-n junction includes interfaces between an un-doped intrinsic semiconductor region that is between a p-type semiconductor and an n-type semiconductor region. In general, a p-n junction includes an interface between a p-type semiconductor and an n-type semiconductor region. In general, a Schottky junction refers to a metal-semiconductor junction. In many cases, when the semiconductor is n-type, the metal layer is chosen to have a higher workfunction than the semiconductor material, and when the semiconductor is p-type, the metal layer is chosen to have a lower workfunction than the semiconductor material. In some embodiments, an organic material is between the metal and an inorganic semiconductor to form a "hybrid" Schottky junction. For example, in one embodiment, optical material 160 includes a top layer of gold (which is a high-workfunction metal analogous to a p-type material used as the "p" layer) and a bottom layer of pentacene, which form a "hybrid" Schottky junction with an inorganic channel material 130 (the "n" layer), which in one embodiment is comprised of Si. In another embodiment, the said gold layer is comprised of a grid rather than a continuous film to allow better light transmission into pentacene. In another embodiment, a substantially transparent high workfunction polymer such as PEDOT (Poly(3,4-ethylenedioxythiophene)) or PEDOT:PSS (Poly(3,4-ethylenedioxythiophene):Polystyrene sulfonate) is used instead of the gold layer.

For example, in one embodiment, optical material 160 constitutes a stack of organic layers that includes a layer of pentacene that is on top of channel material 130 and a layer of passivation material between optical material 160 and channel material 130. For example, such a passivation material may include a layer of 9,10-phenanthrenequinone (PQ), or a mono-layer of long-chain alcohols or thiols). In some embodiments, one or both of passivation layers and transport/blocking layers (i.e., electron transport/hole-blocking materials) are included as part of optical material 160.

In many embodiments, optical material 160 includes a plurality of materials and layers thereof. In some embodiments, at least one of these layers is composed of amorphous silicon, which, in some embodiments, is doped. For example, in one embodiment, the amorphous silicon is doped with one or more elements (for example, boron) to create a p-type material. In other embodiments, the layer of amorphous silicon is un-doped. In general, the layer(s) of material included in optical material 160 are configured to absorb photons and generate electron-hole pairs in response.

Silicon is a fourfold coordinated atom that is normally tetrahedrally bonded to four neighboring silicon atoms. In crystalline silicon (c-Si) this tetrahedral structure continues over a large range, thus forming a well-ordered crystal lattice. In amorphous silicon this long range order is not present and the lattice has rather a short-range order. Moreover, not all the atoms within amorphous silicon are fourfold coordinated and some atoms have a dangling bond. These dangling bonds create structural defects by disturbing the short-range order and may cause anomalous electrical behavior. However, hydrogen can be incorporated into the material, which bonds to the dangling bonds and can reduce the dangling bond density by several orders of magnitude. Hydrogenated amorphous silicon (a-Si:H) has a sufficiently low amount of defects to be used within certain types of devices, such as solar photovoltaic cells, particularly in the proto-crystalline growth regime.

In general, upon exposure of optical material 160 to a sufficient amount and/or type of illumination, a voltage bias is generated across the junction formed between the optical material 160 and the channel material 130. This voltage bias modulates the width of the depletion region formed inside the channel material 130, which in turn modulates the current that flows from source structure 150 to drain structure 140. In one embodiment, the voltage bias generated by optical material 160 impedes the current from flowing between source structure 150 and drain structure 140. In another embodiment, the voltage bias generated by optical material 160 facilitates the flow of electricity through channel material 130.

In one embodiment, a combination of amorphous and mono-crystalline silicon/poly-crystalline silicon layers are used to provide high sensitivity to light levels/wavelengths as well as high-drive current when the device is exposed to sufficient illumination. In general, the amorphous silicon layer is used to provide high sensitivity to light levels/wavelengths while the mono-crystalline silicon/poly-crystalline silicon layer is used to provide a pathway to conduct the high-drive current. The mono-crystalline silicon/poly-crystalline silicon layer is grown, for example, using chemical vapor deposition (CVD), from gaseous or liquid precursors, or deposited as an amorphous material, for example by sputtering or plasma-enhanced CVD (PECVD) and then crystallized by laser, or transferred from a bulk crystalline host using known layer transfer techniques such as smart-cut, lift-off or controlled spalling. Hydrogenated amorphous and microcrystalline silicon are typically deposited by plasma-enhanced chemical vapor deposition (PECVD) although other techniques such as hot-wire chemical vapor deposition (HWCVD) may be used as well.

Figure 2:
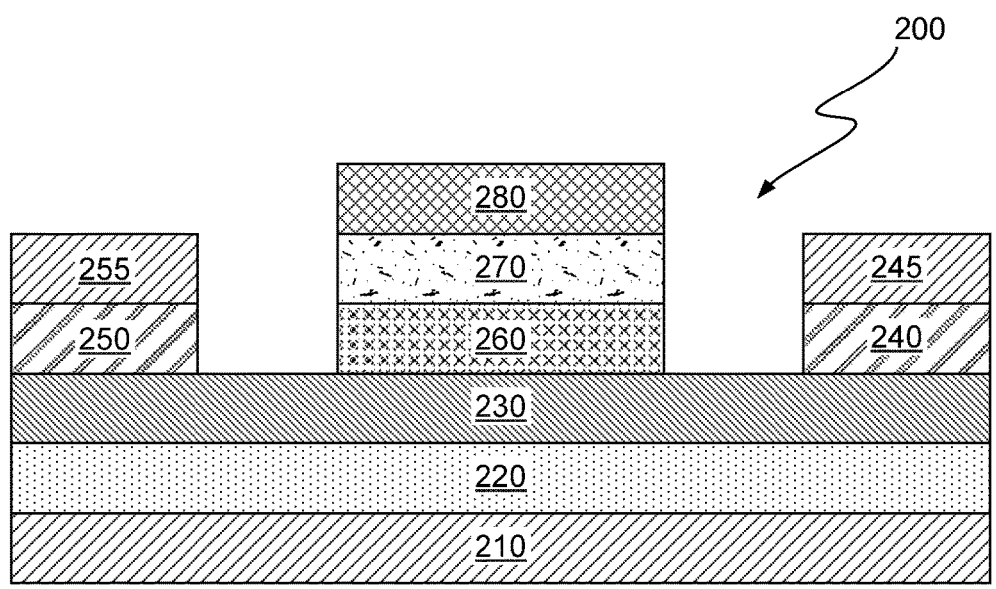
FIG. 2 illustrates a side cut-away view of a light controlled current regulator, in accordance with a second embodiment of the present invention.

FIG. 2 illustrates a light controlled current regulator (LCCR), 200, in accordance with a second embodiment of the present invention. LCCR 200 includes channel material 230. In this embodiment, channel material 230 is a layer of n-type silicon (i.e., is doped to be n-type). For example, channel material 230 is doped with one or more of phosphorus and arsenic. LCCR 200 also includes buried oxide (BOX) layer 220, which is a layer of silicon oxide. In FIG. 2, in place of substrate material 110, LCCR 200 includes a conductive layer 210. Conductive layer 210 is a layer of metal that is connected to a power supply such that electrical voltage can be applied to channel material 230 to control the flow of current through channel material 230. In general, conductive layer 210 is composed of any conductive material, for example copper, aluminum, silver, gold, gallium, titanium and the like, and combinations thereof. Note, as would be understood by one skilled in the Art, the composition of conductive layer 210 can vary greatly. As such, for brevity, further discussion as to the possible compositions of conductive layer 210 is omitted. In various embodiments, the inclusion of conductive layer 210 or substrate material 110 are optional. In some embodiments, only one of conductive layer 210 or substrate material 110 is included. In other embodiments, neither or both of conductive layer 210 are substrate material 110 are included. In the case of both conductive layer 210 and substrate material 110 being included, conductive layer 210 is above substrate material 110, i.e., substrate material 110 is the bottom most layer.

In this embodiment, in place of drain structure 140 is metal layer 245 on top of a layer of heavily doped, n-type hydrogenated crystalline silicon (n+ c-Si:H) 240. Also, in place of source structure 150 is metal layer 255 on top of a layer of heavily doped, n-type hydrogenated crystalline silicon (n+ c-Si:H) 250. In general, n+ c-Si:H 240 and n+ c-Si:H 250 are layers of hydrogenated crystalline silicon that are heavily doped with one or more of phosphorus and arsenic. In general, in this embodiment, hydrogenated crystalline silicon containing layers (such as n+ c-Si:H 240 and n+ c-Si:H 250) contain between 5 to 40 atomic percent hydrogen. In general, metal layer 245 and 255 are similar in possible compositions to conductive layer 210. Note, as would be understood by one skilled in the art, the composition of metal layer 245 and 255 can vary greatly. As such, for brevity, further discussion as to the possible compositions of metal layer 245 and 255 is omitted.

In this embodiment, in place of optical material 160, LCCR 200 includes a first layer of silicon 260, a second layer of silicon 270, and a layer of anti-reflection coating material (ARC) 280. Note that silicon 260, silicon 270, ARC 280 and channel material 230 serve the same general function in LCCR 200 as optical material 160 and channel material 130 did in LCCR 100. Bare silicon has a high surface reflection of over 30%. This level of reflection is reduced by texturing and/or by applying anti-reflection coatings (ARCs) to the surface of the silicon that is exposed to illumination. In some embodiments, the texturing is applied to the surface of the ARC. Typical ARCs consist of a thin layer of dielectric material, with a specially chosen thickness such that interference effects in the coating cause the wave reflected from the anti-reflection coating top surface to be out of phase with the wave reflected from the semiconductor surfaces. These out-of-phase reflected waves destructively interfere with one another, resulting in zero net reflected energy. For example, ARC 280 is a thin layer of one of the following i) hydrogenated amorphous silicon carbide (a-Si:C:H), ii) hydrogenated amorphous silicon nitride (a-Si:N:H), or titanium oxide ($TiO_2$). In other embodiments, the composition for ARC 280 include one or more of silicon nitride ($Si_3N_4$), aluminum oxide ($Al_2O_3$), silicon dioxide ($SiO_2$), zinc-oxide (ZnO), and tantalum oxide ($Ta_2O_5$). Such coating are often formed using PECVD, sputtering or atomic-layer deposition (ALD). In some embodiments, the ARC may be comprised of a transparent conductive oxide such as indium-tin-oxide (ITO) or aluminum-doped zinc-oxide (ZnO:Al), even though the ARC is not required to be electrically conductive.

In one embodiment, silicon 260 is composed of un-doped amorphous silicon (i a-Si:H). In this embodiment, silicon 260 functions, in part, as an insulation or non-conductive region that electrically floats silicon 270 at least part of the time, such as when LCCR 200 is in an "off" state. Silicon 270 is composed of heavily doped p-type hydrogenated amorphous silicon (p+ a-Si:H). In other words, silicon 270 has a doping type opposite to that of channel material 230. For example, silicon 270 is heavily doped with one or more of doped with boron. In another embodiment, silicon 260 is composed of heavily doped p-type hydrogenated crystalline silicon (p+ c-Si:H). In such an embodiment, silicon 270 is composed of one of a) an un-doped amorphous silicon (i a-Si:H) or b) a heavily doped p-type hydrogenated amorphous silicon (p+ a-Si:H).

In some embodiments, materials other than a-Si:H may be used to form one or both of the layers silicon 260 and silicon 270. Examples include hydrogenated amorphous germanium (a-Ge:H), hydrogenated amorphous silicon carbide (a-SiC:H), hydrogenated amorphous silicon germanium (a-SiGe:H), or combinations thereof. In addition, the nano-crystalline or microcrystalline forms of the above mentioned semiconductors or combinations thereof may also be used. These layers may contain nitrogen (N), oxygen (O), fluorine (F), deuterium (D), chlorine (Cl) or combinations thereof. These materials are typically grown by plasma-enhanced chemical vapor deposition (PECVD), however, other growth techniques known in the art, such as hot-wire CVD (HW-CVD) or sputtering may be used as well. In the case of PECVD or HWCVD, the gas source used for growing Si containing layers is typically silane ($SiH_4$) although other gases such as disilane ($Si_2H_6$), dichlorosilane (DCS), tetra-fluorosilane ($SiF_4$) or combinations thereof may be used as well. These gas sources are typically (but not necessarily) mixed with hydrogen during growth. The gas source used for Ge containing layers is typically germane ($GeH_4$). The gas source used for C containing layers is typically methane ($CH_4$), ethylene ($C_2H_4$), propylene ($C_3H_6$) but other sources (typically of the form $C_xH_y$) may be used as well. In-situ p-type doping is typically performed using diborane ($B_2H_6$) or trimethylboron (TMB) sources and in-situ n-type doping is typically performed using phosphine ($PH_3$) gas source, although other dopant sources may be used as well. Ammonia ($NH_3$), nitrous oxide ($N_2O$) or other gas sources may be used for nitrogen containing layers. Carbon dioxide ($CO_2$), $N_2O$ or $O_2$ may be used to provide oxygen for oxygen containing layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth. Growth temperatures are typically close to 200° C., with highest quality films typically grown at temperatures in the range of 150-250° C. However, growth temperatures in the range of room-temperature to 450° C. may be used.

In some embodiments, materials other than c-Si:H may be used to form one or more of the layers silicon 260, n+ c-Si:H 240 and n+ c-Si:H 250. Examples include c-SiGe:H, c-Ge:H and c-SiC:H. The gas sources used for the growth of the hydrogenated crystalline Si, Ge (and SiGe) may include but not limited to $SiH_4$ (silane), $GeH_4$ (germane) (and combination thereof) and $H_2$. Other examples of Si containing gas sources are $Si_2H_6$ and $SiF_4$. Typically the gas flow ratio $[H_2]/([SiH_4]+[GeH_4])>5$. The dopant gases (flowed in-situ)

may include but are not limited to PH$_3$ (phosphine) for n-type doping, and B$_2$H$_6$ (diborane) or TMB (tri-methyl-boron) for p-type doping. These layers may contain nitrogen (N), oxygen (O), fluorine (F), deuterium (D), chlorine (Cl) or combinations thereof. The preferred technique for growing these materials is plasma-enhanced chemical vapor deposition (PECVD), however, other growth such as hot-wire CVD (HWCVD) may be used. The PECVD tool may use RF or microwave power supplied and may or may not have a remote-plasma configuration. Growth temperatures are typically close to 200° C., with highest quality films typically grown at temperatures in the range of 150-250° C. However, growth temperatures in the range of room-temperature to 450° C. may be used.

Figure 3:
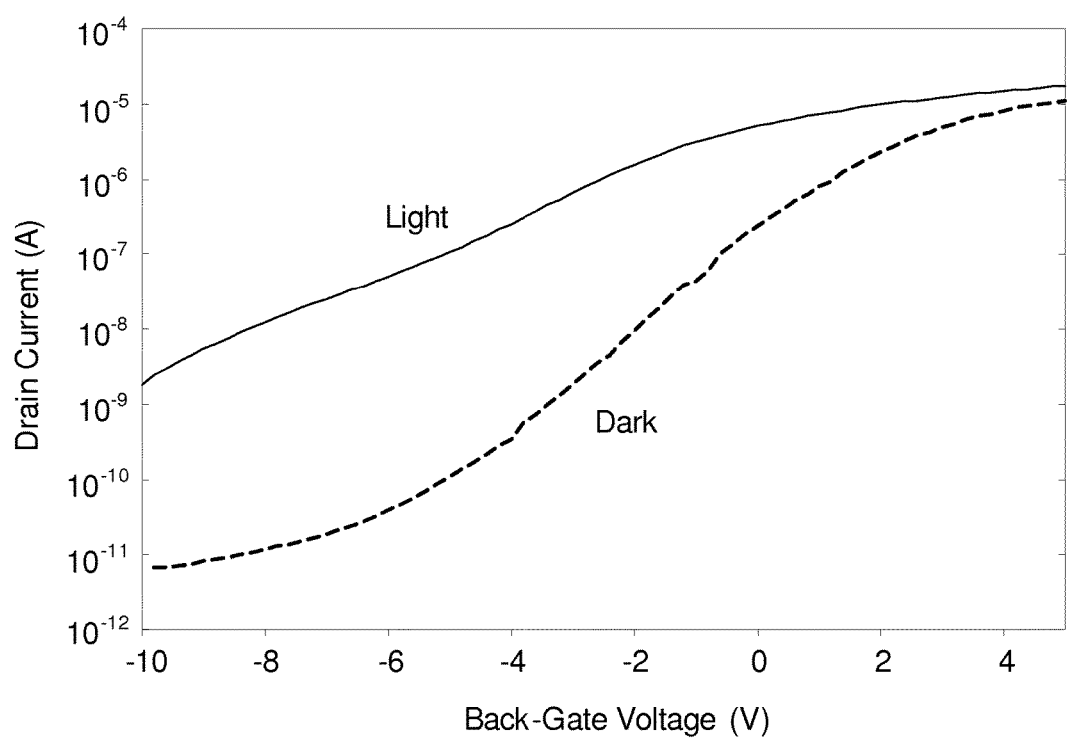
FIG. 3 shows a graph of the measured DC response of an exemplary device according to the embodiment of FIG. 2.

FIG. 3 shows a graph of the measured DC response (i.e. drain current as a function of back-gate voltage at a drain voltage of 0.5V in the dark and under illumination) of an exemplary device according to the embodiment of FIG. 2. In this case, the exemplary device has a channel length/width ratio of 100 μm/40 μm, wherein layer 230 is comprised of n-type single-crystalline silicon doped to a concentration of approximately 7×10$^{15}$ cm$^{-3}$ and having a thickness of approximately 32 nm, layer 220 is comprised of buried oxide (BOX) having a thickness of 140 nm, layers 260 and 270 are comprised of intrinsic and p+ doped hydrogenated amorphous silicon, and layer 280 is comprised of aluminum-doped zinc-oxide. The drain current of the exemplary device is increased by illumination, indicating that current flow in the channel material 230 is facilitated by illuminating optical material 160 comprised of layers silicon 260/silicon 270/layer 280. The dark current and the ratio of the light current to dark current are modulated by varying the back-gate voltage. In this embodiment, the dark current (at a given back-gate voltage) may be reduced by decreasing the doping concentration in the channel material 130 and/or decreasing the thickness of the channel material 130. This is because the ratio of the depletion region width in the channel material 130 underneath the photoelectric element 160, to the thickness of the channel material 130 is increased by decreasing the doping concentration in the channel material 130 and/or decreasing the thickness of the channel material 130.

The layers of material described in these embodiments are formed, in general, from the lowest layers up to the top-most layers. There are many known techniques of semiconductor device manufacturing which can be combined to form the structures disclosed herein. In general, a layer of material is first deposited and then is etched to form structures from the deposited material. This process depositing material and then etching it is repeated until the device has been completed. As such, the embodiments disclosed herein represent not only devices themselves but also the corresponding methods of manufacturing those devices. Further note that other structures, such as electrical wires, filler materials etc., have been excluded from the illustrated embodiments. The structures of and methods of formation of such structures are known in the art and therefore have been omitted for brevity in the description and simplification of the drawings.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques, and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, a chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

As used herein, terms such as "depositing" and the like refer to the disposition of layers or portions of materials in the present embodiments. Such processes include but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, "forming" includes processes of one or both of etching and depositing. These techniques are typically combined to create semiconductor structures of not only specific compositions but also of specific shape.

The methods and structures as described above are used in the fabrication of integrated circuit chips and other like devices.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor device, the semiconductor device comprising:
   a layer of crystalline semiconductor channel material disposed on an insulating substrate;
   a source structure and a drain structure disposed on a top surface of the layer of crystalline semiconductor channel material;
   a photoelectric element disposed between the source structure and the drain structure on the top surface of the layer of crystalline semiconductor channel material, wherein the photoelectric element forms a photosensitive field-effect junction with the layer of crystalline semiconductor channel material along an entire interface between the photoelectric element and the top surface of the layer of crystalline semiconductor channel material, wherein the photoelectric element includes a top layer of gold and a bottom layer of pentacene that forms a schottky junction with an inorganic channel material comprised of silicon, wherein the photoelectric element is electrically floating, and is not provided with an electrode for applying an external bias voltage to the photoelectric element, and wherein the source structure and the drain structure include a layer of conductive material on a layer of doped and hydrogenated silicon that is in contact with the top surface of the layer of crystalline semiconductor channel material,
   wherein the source structure, the drain structure and the photoelectric element are formed in a semiconductor layer that is separate from the crystalline semiconductor channel layer, wherein the photosensitive field-effect junction formed by the photoelectric element includes photovoltaic elements that generate a voltage bias across the photosensitive field-effect junction, and wherein the photosensitive field-effect junction interfaces between an un-doped intrinsic semiconductor region that is between a p-type semiconductor and an n-type semiconductor region; and
   wherein the source structure, the drain structure and the photoelectric element are separate structures with gaps between each of the source structure, the drain structure and the photoelectric element, wherein the drain structure includes layers of hydrogenated crystalline silicon that are heavily doped with phosphorus and arsenic, and wherein the hydrogenated crystalline silicon includes 5 to 40 atomic percent hydrogen.

2. The semiconductor device of claim 1, wherein the source structure and the drain structure form ohmic contacts with the top surface of the layer of crystalline semiconductor channel material such that, upon illumination of the photoelectric element, the layer of crystalline semiconductor channel material forms an electrically conductive channel between the source structure to the drain structure and facilitates a flow of current through the layer of crystalline semiconductor channel material.

3. The semiconductor device of claim 1, the semiconductor device further comprising: a layer of anti-reflection material covering at least a portion of the photoelectric element.

4. The semiconductor device of claim 1, wherein the photoelectric element includes one or more hydrogenated amorphous silicon containing layers.

5. The semiconductor device of claim 4, wherein at least one of the hydrogenated amorphous silicon containing layers has a doping type opposite to that of the crystalline semiconductor substrate.

6. The semiconductor device of claim 4, wherein at least one of the one or more layers of hydrogenated silicon containing material has a doping type opposite to that of the crystalline semiconductor substrate.

7. The semiconductor device of claim 1, wherein one or both of the source structure and the drain structure include one or more layers of hydrogenated silicon containing material grown by PECVD at temperatures below 400 degrees Celsius.

8. The semiconductor device of claim 1, wherein one or both of the source structure and the drain structure include one or more layers of doped hydrogenated silicon containing material grown by PECVD at temperatures below 400 degrees Celsius.

9. The semiconductor device of claim 1, wherein the layer of crystalline semiconductor channel material and a portion of the photoelectric element constitute one of a p-i-n structure or a p-n structure.

10. The semiconductor device of claim 1, wherein the layer of crystalline semiconductor channel material is a doped silicon material.

11. A method of forming a semiconductor device, the method comprising:
   forming a layer of crystalline semiconductor channel material disposed on an insulating substrate;
   forming a source structure and a drain structure disposed on a top surface of the layer of crystalline semiconductor channel material;
   forming a photoelectric element disposed between the source structure and the drain structure on the top surface of the layer of crystalline semiconductor channel material, wherein the photoelectric element forms a photosensitive field-effect junction with the layer of crystalline semiconductor channel material along an entire interface between the photoelectric element and the top surface of the layer of crystalline semiconductor channel material, wherein the photoelectric element includes a top layer of gold and a bottom layer of pentacene that forms a schottky junction with an inorganic channel material comprised of silicon, wherein the photoelectric element is electrically floating, and is not provided with an electrode for applying an external bias voltage to the photoelectric element, and wherein the source structure and the drain structure include a layer of conductive material on a layer of doped and hydrogenated silicon that is in contact with the top surface of the layer of crystalline semiconductor channel material, wherein the source structure, the drain structure and the photoelectric element are formed in a semiconductor layer that is separate from the crystalline semiconductor channel layer, wherein the photosensitive field-effect junction formed by the photoelectric element includes photovoltaic elements that generate a voltage bias across the photosensitive field-effect junction, and wherein the photosensitive field-effect junction interfaces between an un-doped intrinsic semiconductor region that is between a p-type semiconductor and an n-type semiconductor region; and wherein the source structure, the drain structure and the photoelectric element are separate structures with gaps between each of the source structure, the drain structure and the photoelectric element, wherein the drain structure includes layers of hydrogenated crystalline silicon that are heavily doped with phosphorus and arsenic, and wherein the hydrogenated crystalline silicon includes 5 to 40 atomic percent hydrogen.

12. The method of claim 11, the method comprising: forming the layer of conductive material connected to a voltage source; and forming a layer of insulating substrate on the layer of conductive material.

13. The method of claim 11, the method comprising: forming a layer of anti-reflection material on the photoelectric element.

14. The method of claim 11, wherein the forming of the source structure and the drain structure further comprises: forming one or more ohmic contacts with the top surface of the layer of crystalline semiconductor channel material such that, upon illumination of the photoelectric element, the layer of crystalline semiconductor channel material forms an electrically conductive channel between the source structure and the drain structure and thereby facilitates a flow of current through the layer of crystalline semiconductor channel material.

* * * * *